(12) United States Patent
Helton (10) Patent No.: US 8,438,326 B2
(45) Date of Patent: May 7, 2013

(54) SCALABLE MEMORY INTERFACE SYSTEM

(75) Inventor: Sanford L. Helton, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 282 days.

(21) Appl. No.: 12/795,431

(22) Filed: Jun. 7, 2010

(65) Prior Publication Data

US 2011/0302356 A1  Dec. 8, 2011

(51) Int. Cl.
*G06F 12/00* (2006.01)

(52) U.S. Cl.
USPC ..... 711/103; 711/155; 711/167; 711/E12.008

(58) Field of Classification Search .................. 711/103, 711/155, 167
See application file for complete search history.

(56) References Cited

U.S. PATENT DOCUMENTS

| | | | |
|---|---|---|---|
| 6,519,688 B1 * | 2/2003 | Lu et al. ......................... | 711/167 |
| 7,020,728 B1 | 3/2006 | Jones et al. | |
| 7,167,023 B1 | 1/2007 | Pan et al. | |
| 2008/0307184 A1 * | 12/2008 | Barnum et al. ............... | 711/167 |
| 2009/0043955 A1 * | 2/2009 | Butt et al. ..................... | 711/105 |
| 2009/0193201 A1 * | 7/2009 | Brittain et al. ............... | 711/154 |
| 2010/0146321 A1 * | 6/2010 | Stark ............................ | 713/503 |
| 2011/0298511 A1 | 12/2011 | Swanson et al. | |
| 2011/0299347 A1 | 12/2011 | Swanson et al. | |
| 2011/0299351 A1 | 12/2011 | Schultz | |

* cited by examiner

*Primary Examiner* — Reginald Bragdon
*Assistant Examiner* — Aracelis Ruiz
(74) *Attorney, Agent, or Firm* — Kevin T. Cuenot (57) ABSTRACT

A memory interface system can include a memory controller configured to operate at a first operating frequency. A physical interface block can be coupled to the memory controller. The physical interface block can be configured to communicate with the memory controller at the first operating frequency and communicate with a memory device at a second operating frequency that is independent of the first operating frequency.

16 Claims, 3 Drawing Sheets

SCALABLE MEMORY INTERFACE SYSTEM

FIELD OF THE INVENTION

One or more embodiments disclosed within this specification relate to integrated circuits (ICs). More particularly, one or more embodiments relate to a scalable memory interface system for use within an IC.

BACKGROUND

Programmable integrated circuit (IC) devices are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect and programmable logic circuits are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

SUMMARY

One or more embodiments disclosed within this specification relate to integrated circuits (ICs) and, more particularly, to a scalable memory interface system for use within an IC. One embodiment of the present invention can include a memory interface system. The system can include a memory controller configured to operate at a first operating frequency and a physical interface block coupled to the memory controller. The physical interface block can be configured to communicate with the memory controller at the first operating frequency and communicate with a memory device at a second operating frequency that is independent of the first operating frequency.

Another embodiment of the present invention can include a physical memory interface including an asynchronous clock boundary. The physical memory interface can include an input first-in-first-out (FIFO) memory configured to receive data from a memory, an output FIFO memory configured to send data to the memory, and a FIFO memory configured to send commands to the memory. The physical memory interface can include a physical interface control block having a plurality of timers that regulate when a first port of each FIFO memory configured to operate at a first operating frequency passes data. Each FIFO memory also can include at least a second port configured to operate at a second operating frequency.

Another embodiment of the present invention can include an integrated circuit including a memory interface system. The memory interface system can include a memory controller operating within a first clock domain and a physical interface block. The physical interface block can include a first portion configured to communicate with the memory controller within the first clock domain and a second portion configured to operate in a second clock domain within which a memory coupled to the physical interface block operates.

DETAILED DESCRIPTION OF THE DRAWINGS

While the specification concludes with claims defining the features of one or more embodiments of the invention that are regarded as novel, it is believed that the one or more embodiments of the invention will be better understood from a consideration of the description in conjunction with the drawings. As required, one or more detailed embodiments of the present invention are disclosed herein; however, it is to be understood that the one or more embodiments disclosed are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of one or more embodiments of the invention.

One or more embodiments disclosed within this specification relate to integrated circuits (ICs) and, more particularly, to a scalable memory interface system for use within an IC. A memory interface system configured in accordance with one or more embodiments of the present invention can incorporate an asynchronous boundary between the control layer and the physical interface layer of the memory interface system. The memory interface system can include a memory controller and a physical interface block that can operate within separate and independent clock domains.

The memory controller can be configured to operate within one clock domain, while the physical interface block operates, in general, within a different clock domain. The clock domain of the physical interface block can operate at or about the same frequency at which the memory device to which the physical interface block is coupled. By placing an asynchronous clock boundary within the memory interface system, the operating frequency of the control layer can be maintained independently of the operating frequency of the physical layer and the memory device. Accordingly, the operating frequency of the control layer can be scaled as needed and matched with other system elements in communication with the control layer of the memory interface system.

Figure 1:
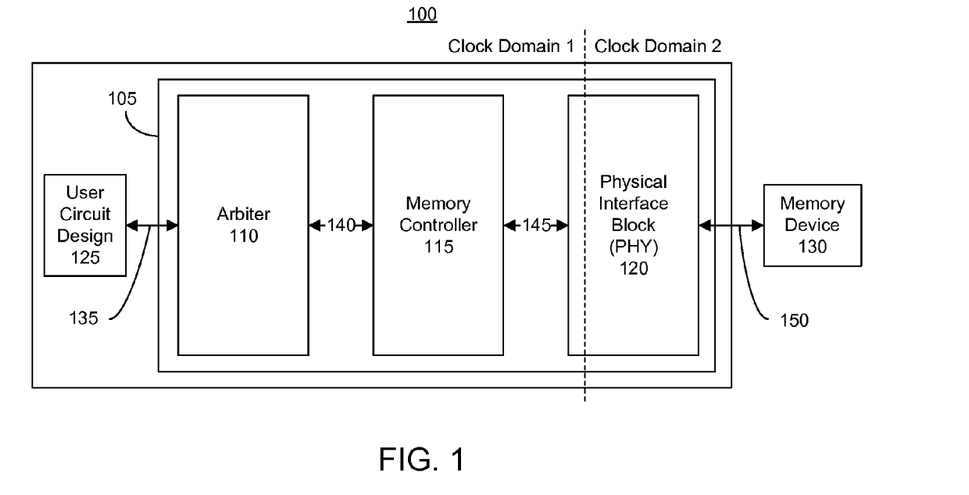
FIG. 1 is a first block diagram illustrating a memory interface system disposed within an integrated circuit in accordance with one embodiment of the present invention.

FIG. 1 is a first block diagram illustrating a memory interface system (system) 105 disposed within an IC 100 in accordance with one embodiment of the present invention. System 105 can be implemented within IC 100 to facilitate communication with a source synchronous device such as a memory device 130. As shown, system 105 can include an arbiter 110, a memory controller 115, and a physical interface block (PHY) 120.

In one or more embodiments, IC 100 can be implemented as a programmable IC. The one or more embodiments disclosed herein, however, are not intended to be limited to implementation or use within programmable ICs. Rather, IC 100 can be implemented as any of a variety of different IC types. For example, IC 100 can be implemented in the form of a processor having an embedded memory controller, an application specific IC, a mixed signal IC, or other type of non-programmable IC.

Memory device 130 can be implemented as any of a variety of dual data rate (DDR) synchronous dynamic random access memory (SDRAM) devices. For example, memory device 130 can be implemented in the form of a DDR type of memory device, a DDR2 type of device, a DDR3 type of device, or a low power DDR (LPDDR or mobile DDR) type of device having a standard memory interface.

Arbiter 110 can be coupled to a user circuit design 125 implemented within IC 100. Arbiter 110 can be coupled to a user circuit design 125 via one or more channels 135. Arbiter 110 can monitor for user requests for access to memory device 130 made over channels 135. For example, arbiter 110, responsive to detecting one or more user requests for access to memory device 130, can determine channel prioritization. Responsive to determining user request priority, arbiter 110 can sub-divide the received user requests into one or more DDR access requests, order the DDR requests, and submit the DDR requests to memory controller 115 over signal 140.

Memory controller 115 can manage the flow of data going into and coming out of memory device 130. Memory controller 115 can generate the commands for writing data to, and reading data from, memory device 130. Memory controller 115 further can perform functions such as determining the order in which commands are executed by PHY 120. For example, memory controller 115 can reorder DDR requests received from arbiter 110 according to user designated channel priority so that requests received in one channel are given priority over another despite the existence of pre-existing requests from other channels.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two or more components connected by a signal or wire as the case may be.

PHY 120 is coupled to memory controller 115 via signal 145 and to memory device 130 via signal 150. In general, PHY 120 implements an asynchronous boundary between clock domain 1 that can include memory controller 115 and arbiter 110 and clock domain 2 that can include the physical input/outputs (I/O) circuitry of IC 100 that couples to memory device 130, e.g., PHY 120. Accordingly, PHY 120 can communicate with memory device 130 at the full operating frequency supported by memory device 130 and communicate with memory controller 115 at a different and independent frequency. For example, memory controller 115 can operate at a frequency that is asynchronous to that of PHY 120 and, thus, memory device 130.

In accordance with one or more embodiments, PHY 120 implements a variety of real-time processing functions that typically are implemented by conventional memory controllers. By including real-time processing functions within PHY 120, memory controller 115 can operate at a different operating frequency than PHY 120 or memory device 130. For example, PHY 120 can perform a variety of clock signal generation, signal alignment, and transaction management functions ordinarily performed by memory controller 115. By relocating such functions within PHY 120, greater control over distortions on the clock lines can be achieved. Further, memory controller 115 can function at a higher level of abstraction. For example, memory controller 115 can perform data flow operations without regard for managing real time events to be described in greater detail within this specification.

As noted, IC 100 can be implemented as a programmable IC. In one or more embodiments where system 105 is implemented within a programmable IC, system 105 can be implemented using a combination of hardened circuits and "soft" circuits. A "hard circuit" refers to a predetermined and, thus, preconfigured circuit that is implemented within IC 100. A hard circuit, for example, while sometimes being at least partially configurable in some respect, is not instantiated by loading configuration data into the programmable IC. The hard circuit exists on the programmable IC irrespective of whether configuration data is loaded.

By comparison, a "soft circuit" refers to a circuit design that is specified using software, e.g., a programmatic description of the circuit specified using a hardware description language, netlist, or the like. The programmatic description of the circuit design is converted, e.g., compiled, into configuration data that can be loaded into configuration memory of the programmable IC. Loading the configuration data into configuration memory effectively instantiates a circuit design. More particularly, the configuration data, when loaded into the programmable IC, configures general programmable circuitry within the programmable IC to implement the specified circuit design.

In some cases, the programmable circuitry of a programmable IC operates at a frequency that is slower than a modern memory device. Using an asynchronous boundary as described within this specification allows elements such as arbiter 110 and memory controller 115 to be implemented using the programmable circuitry of a programmable IC. Thus, arbiter 110 and memory controller 115 can be implemented in the form of "soft circuits" that can operate at a clock rate that is slower than that of memory device 130. PHY 120, which communicates with memory device 130, can be implemented in the form of one or more hard circuit(s) that function at the operational frequency of memory device 130, e.g., faster than arbiter 110 and/or memory controller 115.

In operation, arbiter 110 can monitor for user requests received from user circuit design 125 over one or more of channels 135. Arbiter 110 can implement a selected arbitration scheme to fairly select and order user requests for processing by memory controller 115. One or more portions of user circuit design 125 and arbiter 110 can operate and, thus, communicate, at an operating frequency defining clock domain 1 and corresponding to one or more portions of user circuit design 125. Clock domain 1, and thus the operating frequency defining clock domain 1, can be referred to as the IC operating frequency.

Memory controller 115 can prioritize and reorder user requests received from arbiter 110 for efficient read/write access with respect to memory device 130. Memory controller 115 can reorder user requests independently of any order initially determined by arbiter 110. Memory controller 115, like arbiter 110, can operate at the IC operating frequency. Memory controller 115 can process the received user requests and issue one or more PHY control words to PHY 120 via signal 145 along with exchanging any data in support of reads and/or writes to memory device 130.

PHY 120 can receive the PHY control words from memory controller 115 for controlling access to memory device 130. PHY 120 can include one of more first-in-first-out (FIFO) memories. The FIFO memories support the sending of data and commands to memory device 130, the receipt of PHY control words from memory controller 115, and the receipt of data read from memory device 130.

In general, the FIFO memories facilitate crossing between clock domain 1 and clock domain 2. Once data, commands, and PHY control words are clocked into the FIFO memories located within PHY 120, the remainder of PHY 120 can operate at a different operating frequency defining clock domain 2. Memory device 130 and the remaining portions of PHY 120 to be described herein in greater detail can operate at this different operating frequency referred to as the memory device (MD) operating frequency. Thus, channels 135 and signals 140 and 145 can be clocked at the IC operating frequency. Signal 150 coupling PHY 120 and memory device 130 can be clocked at the MD operating frequency.

Figure 2:
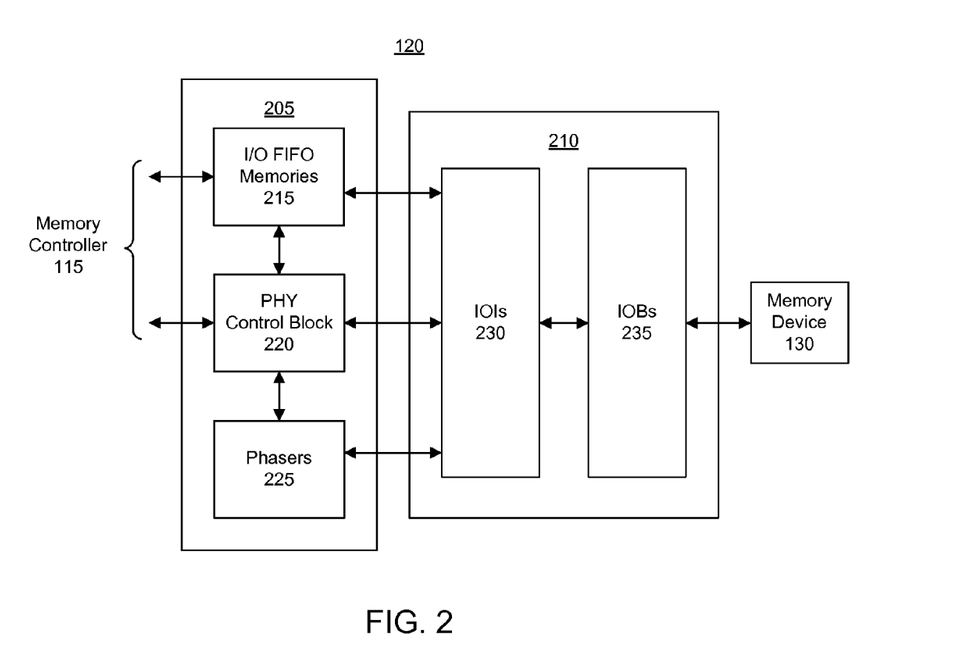
FIG. 2 is a second block diagram illustrating a physical interface layer for use with a memory interface system in accordance with another embodiment of the present invention.

FIG. 2 is a second block diagram illustrating a physical interface layer for use with a memory interface system in accordance with another embodiment of the present invention. FIG. 2 illustrates one exemplary implementation of PHY 120 described with reference to FIG. 1. Like numbers will be used to refer to the same items throughout this specification. In general, PHY 120 can be arranged into two general modules or, in the case of a programmable IC, for example, two general columns. PHY 120 can include a clock management module 205 and an input/output (I/O) module 210. As shown, clock management module 205 is coupled to memory controller 115 and to I/O module 210. I/O module 210 is coupled to memory device 130.

Clock management module 205 can include one or more input/output (I/O) FIFO memories 215, a PHY control block 220, and one or more phasers 225. Each of I/O FIFO memories 215, PHY control block 220, and phasers 225 can be coupled to I/O module 210. I/O module 210 can include one or more I/O interconnect tiles (IOIs) 230 and one or more I/O blocks (IOBs) 235. Each of FIFO memories 215, PHY control block 220, and phasers 225 can be coupled to IOIs 230. IOIs 230 can be coupled to IOBs 235.

I/O FIFO memories 215 can include one or more input FIFO memories and one or more output FIFO memories. Each FIFO memory can be configured to send data and/or commands from IC 100 to memory device 130 or to receive data from memory device 130 within IC 100. For each of FIFO memories 215, a first port can be coupled to memory controller 115 and can be configured to operate at the IC operating frequency, which is the same as memory controller 115. A second port of each of FIFO memories 215 can be coupled to 101 230. Each second port of the FIFO memories 215 can be configured to operate at the MD operating frequency which is the frequency at which memory device 130 operates.

PHY control block 220 provides centralized control for PHY 120. PHY control block 220 can receive PHY control words from memory controller 115 and, in response, control or regulate the transfer of data through I/O FIFO memories 215 between memory controller 115 and 101 230. PHY control block 220 can receive the PHY control words from memory controller 115 at approximately the rate of the IC operating frequency. The PHY control words can be processed at a rate of the MD operating frequency. In addition, PHY control block 220 can be configured to control phasers 225.

Phasers 225 provide a variety of clocking and signal capture functions for controlling operations within PHY 120. For example, phasers 225 can generate clock signals within PHY 120, e.g., local to each element operating at or about the MD operating frequency. By including clocking circuitry within PHY 120, distortions and jitter in the clocking signals can be minimized. Phasers 225 can implemented in the form of one or more input phasers and one or more output phasers. In one or more embodiments, one input phaser and one output phaser can be implemented for a limited number of IOBs. For example, each set of 12 IOBs can be controlled by one input phaser and/or one output phaser as the case may be. Restricting the number of pins controlled by a particular one of phasers 225 reduces the load on the clock signals and further reduces distortions and/or jitter on the clock signals.

Each of phasers 225, e.g., whether an input phaser or an output phaser, can be configured to receive a continuous frequency reference clock and a non-continuous phase reference. Additional control and/or reset signals also can be provided to each of phasers 225. Each of phasers 225 can, for example, lock to the continuous frequency reference clock.

Once frequency lock is achieved, each of phasers 225 can output one or more signals having a fixed phase relationship to the phase reference clock. The phase reference clock, for example, can be a data strobe signal, e.g., a "DQS signal," that is received via an external pin from memory device 130.

IOIs 230 can include one or more serializers and one or more deserilizers. Data from I/O FIFO memories 215 that is being output from PHY 120 and written to memory device 130 can be serialized via IOIs 230. Data received, e.g., read, into PHY 120 from memory device 130 can be deserialized via IOIs 230. Each of IOBs 235 represents circuitry that is configured to couple the serial port of IOIs 230, e.g., a single bit signal, to an I/O pin or an I/O pad of IC 100.

Figure 3:
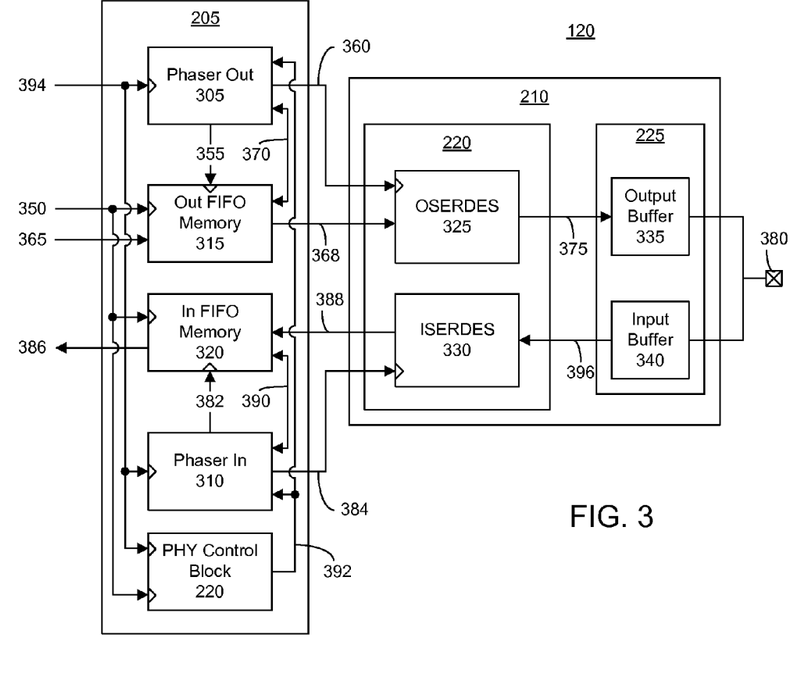
FIG. 3 is a third block diagram illustrating an aspect of a physical interface layer for use with a memory interface system in accordance with another embodiment of the present invention.

FIG. 3 is a third block diagram illustrating an aspect of a physical interface layer for use with a memory interface system in accordance with another embodiment of the present invention. FIG. 3 illustrates an example of a data path architecture within PHY 120 in greater detail than illustrated with reference to FIG. 2. As shown, clock management module 205 can include a phaser out 305, a phaser in 310, an out FIFO memory 315, an in FIFO memory 320, and PHY control block 220. Within I/O module 210, 101 220 can be configured to include an output serializer/deserializer (OSERDES) 325 and an input serializer/deserializer (ISERDES) 330. IOBs 225 can include an output buffer 335 and an input buffer 340.

Phaser out 305 and phaser in 310 can receive a clock signal 394, which can be at the MD operating frequency. In one or more embodiments, clock signal 394 can be generated locally by a source (not shown) within PHY 120 or within clock management module 205. Phaser out 305, in turn, can generate one or more clock signals at the MD operating frequency. In one or more embodiments, phaser out 305 can generate a plurality of clock signals at the MD operating frequency wherein each clock signal has a different phase offset. Phaser out 305 is coupled to out FIFO memory 315 via signal 355 and coupled to OSERDES 325 via signal 360. Signals 355 and 360 can represent, at least in part, one or more clock signals generated and provided by phaser out 305 at the MD operating frequency for controlling those portions of the data output path through PHY 120 that operate at the frequency of the memory device.

It should be appreciated that OSERDES 325 can require an additional clock signal to facilitate serialization of data. Thus, in one or more embodiments, signal 360 can represent a first clock signal at the MD operating frequency and a second clock signal having a frequency that is a fraction of the MD operating frequency, wherein the particular fraction used depends upon the degree of serialization being performed by OSERDES 325. The second clock signal, for example, can be ½, ⅓, ¼, ⅙, ⅐, ⅛, or the like.

Out FIFO memory 315 can be configured as a dual port memory having an input port and an output port that can operate asynchronously with respect to one another. The input port of out FIFO memory 315 can be coupled to the memory controller via signal 365, over which data is received and, thus, clocked by clock signal 350 at the IC operating frequency. In one or more embodiments, the input port of out FIFO memory 315 can be write enabled via the memory controller. The output port of out FIFO memory 315 can be indirectly controlled by PHY control block 220 via signals 392 and 370 to read data from out FIFO memory 315 responsive to received PHY control words from the memory controller. For example, PHY control block 220 can instruct, via signal 392, phaser out 305 to read enable the output port of out FIFO memory 315 via signal 370. As shown, PHY control block 220 also can receive clock signal 350 corresponding to the IC operating frequency and clock signal 394 corresponding to the MD operating frequency. Data can be read from out FIFO memory 315 only when the data belonging to, or associated with, the received PHY control word(s) are available.

The output port of out FIFO memory 315 can output data to OSERDES 325 through signal 368. The output port can be clocked according to a clock signal at the MD operating frequency that is generated by phaser out 305 and represented, at least in part, by signal 355. Phaser out 305 can regulate the output port of out FIFO memory 315, e.g., read enabling the output port, to control the flow of data from out FIFO memory 315 to OSERDES 325 via signal 370. OSERDES 325 serializes data received from out FIFO memory 315 via signal 368 and outputs the resulting serialized data to output buffer 335 via signal 375. Output buffer 335 then outputs the serial data to the memory device via pin 380.

Like phaser out 305, phaser in 310 can generate one or more clock signals at the MD operating frequency. In one or more embodiments, phaser in 310 can generate a plurality of clock signals at the MD operating frequency wherein each clock signal has a different phase. Phaser in 310 is coupled to in FIFO memory 320 via signal 382 and coupled to ISERDES 330 via signal 384. Signals 382 and 384 can represent, at least in part, one or more clock signals generated and provided by phaser in 310 at the MD operating frequency for controlling those portions of the data input path through PHY 120 that operate at the frequency of the memory device.

ISERDES 330, like OSERDES 325, can require an additional clock signal to facilitate de-serialization of data. Thus, in one or more embodiments, signal 360 can represent a first clock signal at the MD operating frequency and a second clock signal having a frequency that is a fraction of the MD operating frequency, wherein the fraction used depends upon the degree of de-serialization being performed by ISERDES 330. The second clock signal, for example, can be ½, ⅓, ¼, ⅙, ⅐, ⅛, or the like.

In FIFO memory 320 can be configured as a dual port memory having an input port and an output port that can operate asynchronously with respect to one another. The output port of in FIFO memory 310 can be coupled to the memory controller via signal 386, over which data is sent. In one or more embodiments, the output port of in FIFO memory 320 can be read enabled via the memory controller and clocked by clock signal 350. The input port of in FIFO memory 320 can be indirectly controlled by PHY control block 220, e.g., via signals 392 and 390, to write data out to in FIFO memory 320 responsive to received PHY control words from the memory controller. For example, PHY control block 220 can instruct, via signal 392, phaser in 310 to write enable the input port of in FIFO memory 320 via signal 390.

ISERDES 330 deserializes data received from input buffer 340 from pin 380. Input buffer 340 conveys data to ISERDES 330 via signal 396. ISERDES 330 outputs the resulting deserialized data to the input port of in FIFO memory 320 via signal 388. The input port of in FIFO memory 320 can receive data from ISERDES 330 through signal 388. The input port of in FIFO memory 320 can be clocked according to a clock signal at the MD operating frequency that is generated by phaser in 310 and represented, at least in part, by signal 382. Phaser in 310 can regulate the input port of in FIFO memory 320, e.g., write enabling the input port, to control the flow of data into in FIFO memory 320 from ISERDES 330 via signal 390.

Figure 4:
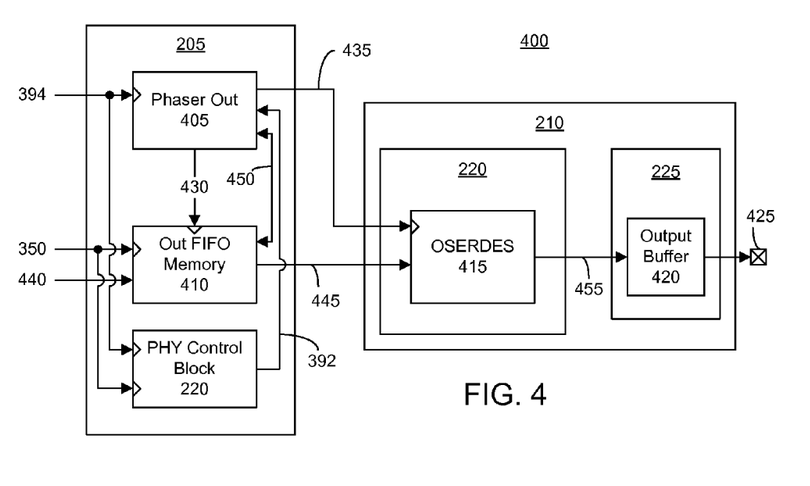
FIG. 4 is a fourth block diagram illustrating another aspect of a physical interface layer for use with a memory interface system in accordance with another embodiment of the present invention.

FIG. 4 is a fourth block diagram illustrating another aspect of a physical interface layer for use with a memory interface system in accordance with another embodiment of the present invention. FIG. 4 illustrates an example of a control path architecture within PHY 120 in greater detail than illustrated with reference to FIG. 2. As shown, clock management module 205 can include a phaser out 405 and an out FIFO memory 410. Within I/O module 210, 101 220 can be configured to include an OSERDES 415. IOBs 225 can include an output buffer 420 coupled to an output pin 425.

Phaser out 405 can receive clock signal 394 at the MD operating frequency and generate one or more clock signals at the MD operating frequency. Phaser out 405 can generate a plurality of clock signals at the MD operating frequency wherein each clock signal has a different phase. Phaser out 405 is coupled to out FIFO memory 410 via signal 430 and coupled to OSERDES 415 via signal 435. As described, signal 435 can represent a first clock signal at the MD operating frequency and a second clock signal having a frequency that is a multiple of the MD operating frequency, wherein the multiple used depends upon the degree of serialization being performed by OSERDES 325. Signals 430 and 435 can represent, at least in part, one or more clock signals generated and provided by phaser out 405 at the MD operating frequency for controlling those portions of the data output path through PHY 120 that operate at the frequency of the memory device.

Out FIFO memory 410 can be configured as a dual port memory having an input port and an output port that can operate asynchronously with respect to one another. The input port of out FIFO memory 410 can be coupled to the memory controller via signal 440, over which commands to be output to the memory device can be received and, thus, clocked by clock signal 350. The memory controller further can control write enabling of the input port of out FIFO memory 410. The output port of out FIFO memory 410 can be indirectly controlled by PHY control block 220 via signals 392 and 450 to read commands out of out FIFO memory 410 responsive to received PHY control words from the memory controller. For example, PHY control block 220 can instruct, via signal 392, phaser out 405 to read enable the output port of out FIFO memory 410 via signal 450.

The output port of out FIFO memory 410 can be configured to output commands to OSERDES 415 through signal 445. The output port of out FIFO memory 410 can be clocked according to a clock signal at the MD operating frequency that is generated by phaser out 405 and represented, at least in part, by signal 430. Phaser out 405 further can regulate, e.g., read enable via signal 450, the output port of out FIFO memory 410 to control the flow of commands from out FIFO memory 410 to OSERDES 415 conveyed through signal 450. OSERDES 415 serializes commands received from out FIFO memory 410 via signal 445 and outputs the resulting serialized commands to output buffer 420 via signal 455. Output buffer 420 then outputs the serialized command to the memory device via pin 425.

Figure 5:
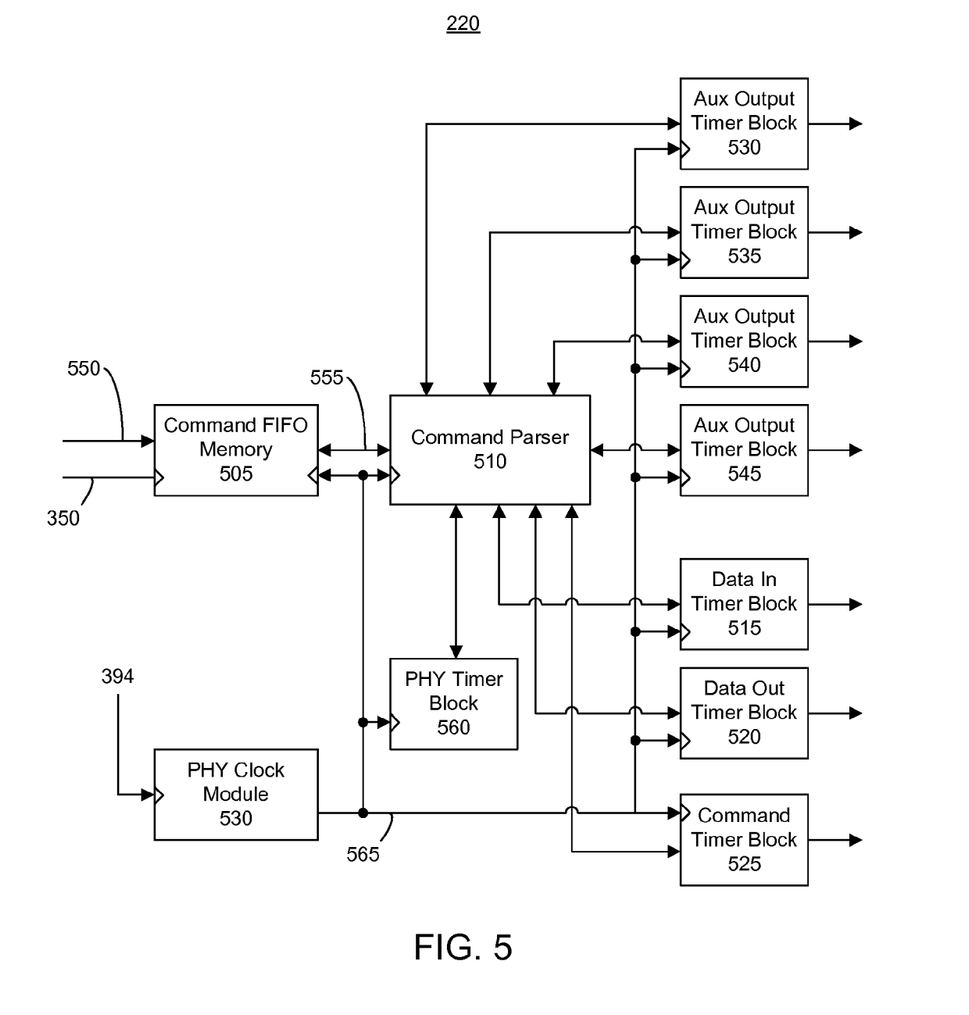
FIG. 5 is a fifth block diagram illustrating another aspect of a physical interface layer for use with a memory interface system in accordance with another embodiment of the present invention.

FIG. 5 is a fifth block diagram illustrating another aspect of a physical interface layer for use with a memory interface system in accordance with another embodiment of the present invention. FIG. 5 illustrates an example of the PHY control block 220 in greater detail than illustrated with reference to FIG. 2. As shown, PHY control block 220 can include a command FIFO memory 505, a command parser 510, a PHY clock module 530, and a plurality of timer blocks.

In general, PHY control block 220 can include two data timer blocks including a data in timer block 515 and a data out timer block 520, a command timer block 525, four auxiliary timers depicted as aux output timer blocks 530, 535, 540, and 545, and PHY timer block 560. It should be appreciated that each timer block illustrated within FIG. 5 can represent one or more, e.g., a plurality, of individual timers available for the purposes described within this specification.

Command FIFO memory 505 can be configured as an asynchronous FIFO having an input port and an output port. Command FIFO memory 505 provides a mechanism for crossing clock domains between that of the memory controller corresponding to the IC operating frequency and the memory device corresponding to the MD operating frequency. The input port of command FIFO memory 505 can be coupled to the memory controller via signal 550 and can be clocked by clock signal 350 at the IC operating frequency. The second port of command FIFO memory 505 can be coupled to command parser 510 via signal 555 and is clocked at the MD operating frequency via signal 565. Each other circuit element within FIG. 5 of PHY control block 210 is clocked at the MD operating frequency by signal 565.

PHY clock module 530 can receive clock signal 394 as an input signal and generate one or more clock signals such as clock signal 565 as output. Clock signal 565 can be at approximately the MD operating frequency to clock circuits operating at the same approximate speed as the memory device.

Command FIFO memory 505 receives PHY control words sent from the memory controller via signal 550, which can be read according to clock signal 565. For purposes of illustration, signal 555 can represent the transfer of data from command FIFO memory 505 in addition to a read enable signal for the output port of command FIFO memory 505 controlled by command parser 510.

Command parser 510 reads PHY command words from command FIFO memory 505 and, in response to executing the PHY command words, writes particular timer values determined by virtue of the PHY command words executed into data in timer block 515, data out timer block 520, command timer block 525, aux output timer blocks 530-545, and/or PHY timer block 560. Command parser 510 can continuously read from command FIFO memory 505 as long as there are available timers, e.g., an available data timer and/or command timer. When all of the data and/or command timers are busy, e.g., no timer is available, command parser 510 can stop reading PHY command words from command FIFO memory 505. By discontinuing the reading of PHY command words, command parser 510 places back pressure on the memory controller which detects the full or filling state of command FIFO memory 505 so as to throttle the flow of commands.

In general, data in timer block 515, data out timer block 520, and/or command timer block 525 can control the management of data and commands going into and coming out from PHY 120 by timing the relationships between command issuance and data availability. For example, command timer 525 can cause an event that sends a CAS strobe initiating a read event. Data in timer block 515 determines the number of clock cycles after the assertion of the CAS strobe when data is available at an output of the ISERDES and is available for transfer to a user. The timer event generated by data in timer block 515 indicates availability of the data. Thus, timers within data in timer block 515 and/or data out timer block 520 can generate events that indicate when to start or stop clocks and when to enable ports of one of the FIFO memories. In this manner, data in timer block 515, data out timer block 520, and command timer block 525 can control the management of data and commands going into and coming out from PHY 120.

Aux output timer blocks 530-545 can include a plurality of timers configured to perform general purpose timing operations. Aux output timer blocks 530-545, for example, can be invoked by command parser 510 at the same time as a command associated with the timer is executed.

In one or more embodiments, the outputs from the timer blocks 515-545 can be multiplexed. Those circuit elements corresponding to data paths within PHY 120 as illustrated with reference to FIG. 3, for example, can be coupled, via the multiplexers, to the data timer blocks 515, 520, and/or one of aux output timer blocks 530-545. The control signals from PHY control block 220 described with reference to FIG. 3 can be provided or output from the data in timer block 515 and/or data out timer block 520 as the case may be. Those circuit elements corresponding to command paths within PHY 120 as illustrated with reference to FIG. 4, for example, can be coupled to the command timer block 525. The control signals from PHY control block 220 described with reference to FIG. 4 can be provided or output from command timer block 525.

For example, referring again to FIG. 3 in combination with FIG. 5, data in timer block 515 can time the reception of data from ISERDES 330. Data in timer block 515 further can manage the interface to phaser in 310. When an active timer within data in timer block 515 reaches the terminal count, data in timer block 515 sends an "In_Burst_Pending" signal to phaser in 310 controlling the data path. Phaser in 310 generates the write enable signals and necessary clock signal to receive the data burst from ISERDES 330. Phaser in 310 further, in response, writes the data burst into in FIFO memory 320. In conjunction with the "In_Burst_Pending" signal, data in timer block 515 also can send the current DDR Rank being read to phaser in 310.

Data out timer block 520 can time when data is read from out FIFO memory 315 and transferred to OSERDES 325. Data out timer block 520 can drive an "Out_Burst_Pending" signal high for one clock cycle at the frequency of the memory device for each DDR burst of data read from out FIFO memory 315. The amount of data read from out FIFO memory 315 can be indicated by a "BURST_MODE" attribute. For example, the "BURST_MODE" attribute can be set high for a burst length of eight transactions and can be set low for a burst length of four transactions.

Referring to FIG. 4 in combination with FIG. 5, command timer block 525 can be used to time when address and/or command information is read from out FIFO memory 410 and transferred to OSERDES 415. There is no need for control of the phasers or tri-state signals from command timer block 525. Only one nibble is read from out FIFO memory 410 for each command timer block 525 event.

PHY timer block 560 is a circuit block that can include one or more timers configured to control higher level functions and timing relationships. PHY timer block 560, unlike other timing blocks illustrated in FIG. 5, does not generate an outbound signal that is distributed outside of PHY control block 220. Rather, PHY timer block 560 communicates with command parser 510 to control different functions within PHY control block 220. In communicating with command parser 510, PHY timer block 560, for example, controls whether or not command parser 510 sends new timer events to other ones of timer blocks 515-545.

In this regard, PHY timer block 560 can cause an event, e.g., a timer event, to occur later in time than the occurrence of the command that initiates the timer event. Thus, the timer event originating from command parser 510 can be delayed under the control of PHY timer block 560. A timer event can remain active for a programmable duration referred to as the event duration under the control of PHY timer block 560.

Aux output timer blocks 530-545 can generate signals to the memory device that do not occur at the exact time as data transfers or commands. The signals can be staggered. Aux output timer blocks 530-545 also can be used to implement "on-die termination" or "ODT" signals within an interface.

For example, timers within PHY timer block 560 can be used to sequence continuous read and/or write commands such as those directed to a same column or general location within the memory device. In another example, timers within PHY timer block 560 also can be used to control spacing between commands issued to the memory device and the number of commands issued over a specified time period.

In further illustration of the functionality that can be achieved through PHY timer block 560, one or more timers within PHY timer block 560 can be used to implement row/bank timers. Row/bank timers enforce rules governing how a memory interface communicates with different banks or pages of a given memory device. For example, row/bank timers can control how close in time access to different banks can occur with respect to one another. In still another example, timers within PHY timer block 560 can control read/write or write/read turnaround. Read/write turnaround timers control how much time must separate a write command that follows a read command. Similarly, a write/read turnaround timer can control how much time must separate a read command that follows a write command.

One or more embodiments disclosed within this specification relate to a memory interface system that includes an asynchronous boundary. The control layer can operate at the IC operating frequency that generally is lower than that of the memory device coupled to the memory interface system. The physical layer can operate, in large part, at or about the frequency of the memory device.

The asynchronous boundary facilitates the offloading of various clocking and timing control functions from the controller layer to the physical layer. Including such functions within the physical layer also allows clock signals to be generated closer to the targets thereby reducing jitter and noise and increasing stability of the memory interface system. Further, by relocating the various clocking and timing functions described into the physical layer, the interface through which user circuit designs can interact with the memory controller can be simplified significantly. The memory controller effectively handles information flow while the offloaded clocking and timing functions are automatically handled within the physical layer.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. A memory interface system comprising:
a memory controller configured to operate at a first operating frequency; and
a physical interface block coupled to the memory controller, wherein the physical interface block is configured to communicate with the memory controller at the first operating frequency and communicate with a memory device at a second operating frequency that is independent of the first operating frequency;

wherein the memory controller and the physical interface block are located within a same integrated circuit and the memory device is located within a different integrated circuit; and wherein the physical interface block comprises:
- a plurality of timers configured to regulate transaction processing within the physical interface block;
- at least one output first-in-first-out (FIFO) memory configured to receive data from the memory controller at a rate corresponding to the first operating frequency and to provide data to the memory device at a rate corresponding to the second operating frequency;
- at least one input FIFO memory configured to receive data from the memory device at a rate corresponding to the second operating frequency and to provide data to the memory controller at a rate corresponding to the first operating frequency;
- a first phaser configured to generate a clock signal at the second operating frequency controlling an output port of the at least one output FIFO memory; and
- at least a second phaser configured to generate a clock signal at the second operating frequency controlling an input port of the at least one input FIFO memory.

2. The memory interface system of claim 1, wherein the physical interface block is a hardened circuit.

3. The memory interface system of claim 1, wherein the physical interface block is configured to generate a clock signal having a fixed phase relationship compared to a received reference signal.

4. The memory interface system of claim 1, wherein the physical interface block further comprises:
- a physical interface control block configured to control clocking of data into an input port of the at least one output FIFO memory at a rate of the first operating frequency and to control clocking of data from an output port of the at least one input FIFO memory at a rate of the first operating frequency.

5. The memory interface system of claim 1, wherein the memory controller is configured to receive user requests for access to a memory device coupled to the physical interface block and, in response, communicate physical interface control words to the physical interface block that specify operations to be performed by the physical interface block upon the memory device.

6. The memory interface system of claim 5, wherein the physical interface block comprises at least one timer, wherein the physical interface block sets the at least one timer with a value determined by at least one of the physical interface control words for controlling a timing function when communicating with a memory device coupled to the physical interface block.

7. The memory interface system of claim 1, wherein the physical interface block comprises:
- at least one first-in-first-out memory configured to receive commands from the memory controller at a rate corresponding to the first operating frequency and to provide the commands to the memory device at a rate corresponding to the second operating frequency.

8. A physical memory interface comprising an asynchronous clock boundary, the physical memory interface comprising:
- an input first-in-first-out (FIFO) memory configured to receive data from a memory;
- an output FIFO memory configured to send data to the memory;
- a FIFO memory configured to send commands to the memory; and
- a physical interface control block comprising a plurality of timers that regulate when a first port of each FIFO memory configured to operate at a first operating frequency passes data, wherein each FIFO memory comprises a second port configured to operate at a second operating frequency;

wherein the physical memory interface is located within a same integrated circuit as a memory controller coupled thereto and the memory is located within a different integrated circuit; and wherein the plurality of timers are configured to regulate transaction processing within the physical memory interface;

wherein the first port of the output FIFO memory is an output port and wherein the first port of the input FIFO memory is an input port, wherein the physical memory interface further comprises:
- a phaser out configured to control read enablement of the output port of the output FIFO memory responsive to events generated by at least one of the plurality of timers and generate a clock signal at the second frequency controlling the output port of the output FIFO memory; and
- a phaser in configured to control write enablement of the input port of the input FIFO memory responsive to events generated by at least one of the plurality of timers and generate a further clock signal at the second frequency controlling the input port of the input FIFO memory.

9. The physical memory interface of claim 8, wherein the second port of each FIFO memory is coupled to a memory controller operating at the second operating frequency.

10. The physical memory interface of claim 9, wherein the memory controller is configured to control enablement of the second port of each FIFO memory.

11. The physical memory interface of claim 8, wherein the physical interface control block further comprises:
- a command FIFO memory configured to receive physical interface control words from a memory controller through an input port operating at the second operating frequency; and
- a command parser configured to read received physical interface control words from an output port of the command FIFO memory operating at the first operating frequency.

12. The physical memory interface of claim 11, wherein the command parser loads timer values within selected ones of the plurality of timers responsive to executing at least one physical interface control word.

13. An integrated circuit comprising:
a memory interface system comprising:
- a memory controller operating within a first clock domain; and
- a physical interface block comprising a first portion configured to communicate with the memory controller within the first clock domain and a second portion configured to operate in a second clock domain within which a memory coupled to the physical interface block operates;

wherein the memory controller is implemented using programmable circuitry and instantiated via loading of configuration data within the integrated circuit and the physical interface block is formed of hardened circuitry; and wherein the physical interface block is configured to generate clock signals for clocking circuit elements of the physical interface block that operate within the second clock domain;

wherein the memory controller is configured to send command words to the physical interface block;

wherein the physical interface block comprises a plurality of timers that are loaded with values according to the command words; and wherein the timer values control transaction processing within the physical interface block with the memory.

14. The integrated circuit of claim 13, wherein the physical interface block stops reading commands received from the memory controller and stored within a command first-in-first-out memory within the physical interface block responsive to determining that all of the timers are busy; and wherein the memory controller throttles a flow of commands to the physical interface block responsive to detecting a full or filling state of the command first-in-first-out memory.

15. The integrated circuit of claim 13, wherein the physical interface block is configured to control at least one of: (a) spacing between commands issued to a memory coupled to the physical interface block, or (b) a number of commands issued to the memory over a specified time period.

16. The integrated circuit of claim 13, wherein the physical interface block is configured to control at least one of: (a) read/write turnaround, or (b) write/read turnaround.

* * * * *